Aug. 30, 1966 R. BOSSE 3,270,286

TRANSISTOR SELF-HETERODYNING MIXER

Filed Nov. 30, 1964

Inventor:
Rolf Bosse

By: Spencer & Kaye
ATTORNEYS

United States Patent Office 3,270,286
Patented August 30, 1966

3,270,286

TRANSISTOR SELF-HETERODYNING MIXER

Rolf Bosse, Benthe, Hannover, Germany, assignor to Telefunken Patentverwertungsgesellschaft m.b.H., Ulm (Danube), Germany Filed Nov. 30, 1964, Ser. No. 414,769
Claims priority, application Germany, Dec. 7, 1963, T 25,216
7 Claims. (Cl. 325—440)

The present invention relates to a transistor circuit. More particularly, the present invention relates to a self-heterodyning transistorized mixer stage, which finds particular use in a television receiver capable of receiving television signals in a lower and a higher frequency band. For purposes of illustration, the lower and higher frequency band may be considered to be constituted by bands I and III, these band designations being conventional, in European television broadcasting, to represent the following ranges: band I designates a frequency range of 68 to 41 megacycles (wavelength: 4.41 to 7.32 meters), and band III designates a frequency range of 223 to 174 megacycles (wavelength: 1.35 to 1.72 meters). Bands I and III thus fall into the VHF (very-high frequency) range. These bands I and III will hereinafter be considered to be the lower and higher frequency bands.

Conventionally, television sets designed for receiving broadcasts within the lower and higher frequency bands can be equipped with transistorized input sections. Such an input section generally contains a high-frequency amplifier stage, a mixer and an oscillator stage. This makes it necessary to provide three transistors, as well as the necessary switching means. In the interests of economy, the mixer and oscillator stages are combined with each other so that the input section needs but two transistors. Certain difficulties do, however, arise when it comes to combining the mixer stage and oscillator, this combined stage being generally known as a self-heterodyning mixer stage, if the amplifier unit is one having only three connecting electrodes. This is particularly so in the case of band I because here the input, intermediate and oscillator frequencies are close together so that it becomes difficult adequately to decouple the individual frequencies from each other. Recently, self-heterodyning mixer stages have been developed for use in television bands I and III, which stages incorporate tube-type triodes. Here, it is attempted to solve the problems incident to the reciprocal frequency influencing in band I by means of bridge circuits, but the inherent drawbacks of such circuits is that they require a larger number of reversing contacts than conventional circuitry operating with a separate oscillator. Furthermore, the bridging circuits require special matching devices. For this reason, self-heterodyning transistorized mixer stages have not as yet found their way into television receivers. A still greater problem incident to the use of a transistor in such a self-heterodyning mixer stage is the fact that bridge circuits, due to the small real part of the parallel input resistance of the transistor at high frequencies, consume a large proportion of the available high frequency input power, thereby reducing the signal-to-noise ratio of the circuit as a whole.

It is, therefore, the primary object of the present invention to overcome the above drawbacks, and, therefore, the present invention relates to a self-heterodyning transistorized mixer stage of a type well known per se where, in a manner similar to the conventional tube-type mixing stages, the base of the transistor is capacitatively grounded for the receiving, oscillator and intermediate frequencies, the received signal is applied to the emitter, and there is connected to the collector the intermediate frequency circuit which has a capacitative branch connected to the oscillator circuit, the feedback from the oscillator circuit to the emitter taking place capacitatively. Such stage is suited particularly for use in television receivers designed to receive bands I and III. Here, the receiving and oscillator circuits are sufficiently decoupled from one another. Here, the influence of the tuning of the intermediate frequency circuit, upon channel-switching, should be as small as possible, and the reaction of the intermediate frequency on the input of the transistor is to be avoided.

Heretofore, the coil and the capacitor of the oscillator circuit, which behaves inductively for the lower intermediate frequency, were so dimensioned that the oscillator circuit represents an impedance that is very small as compared to the capacitance of the intermediate frequency circuit and detunes but slightly the intermediate frequency circuit even when switched to other channels, and is tuned to a channel in the middle of the whole frequency band, the switching operation to channels of the higher frequency (in band III) takes place by connecting different inductances in parallel with the oscillator circuit and switching to the channels of the lower frequency (band I) by connecting different capacitors in parallel with the oscillator circuit, the feedback path of the oscillator being blocked by a broad-band wave trap for the intermediate frequency. It is, however, frequently desired that the receiver be tunable to channels in the bands I and III by means of a capacitor, for example, a variable capacitor. This, however, was not possible in the circuit as it has become known heretofore.

Accordingly, the above problem is solved by providing a self-heterodyning transistor mixer stage in which the receiving, oscillator and intermediate frequency are all close to one another, which stage comprises a transistor having a base, collector and emitter, there being means for capacitatively grounding the base for the receiving, oscillator and intermediate frequencies. Means are provided for applying the received signal to the emitter, and an intermediate frequency circuit is connected to the collector, this intermediate frequency circuit having means forming a capacitative branch and a frequency-determining circuit component. Also provided is an oscillator circuit having switchable coil means and tuning capacitor means this oscillator circuit being connected to the capacitative branch of the intermediate frequency circuit. Also, there are means for providing a capacitative feedback connector from the oscillator circuit to the emitter. The coil means and the tuning capacitor means of the oscillator circuit act inductively for the intermediate frequency in the lower band and are dimensioned to impart to the oscillator circuit an impedance which is very small as compared to the capacitance of the capacitative branch of the intermediate frequency circuit and which, even when the capacitance of the tuning capacitor means is varied, detunes the intermediate frequency circuit but slightly, this oscillator circuit being tuned to a channel which is in the middle of the entire frequency band. The stage also includes means for switching the coil means of the oscillator circuit for switching the oscillator circuit to respective channels of the lower frequency band. Finally, means are provided for switching the frequency-determining circuit component of the intermediate frequency circuit, when the oscillator circuit is switched, to a value which compensates for a frequency variation of the intermediate frequency circuit that is due to the switching of the oscillator circuit.

Additional objects and advantages of the present invention will become apparent upon consideration of the following description when taken in conjunction with the accompanying drawings in which.

Figure 1:
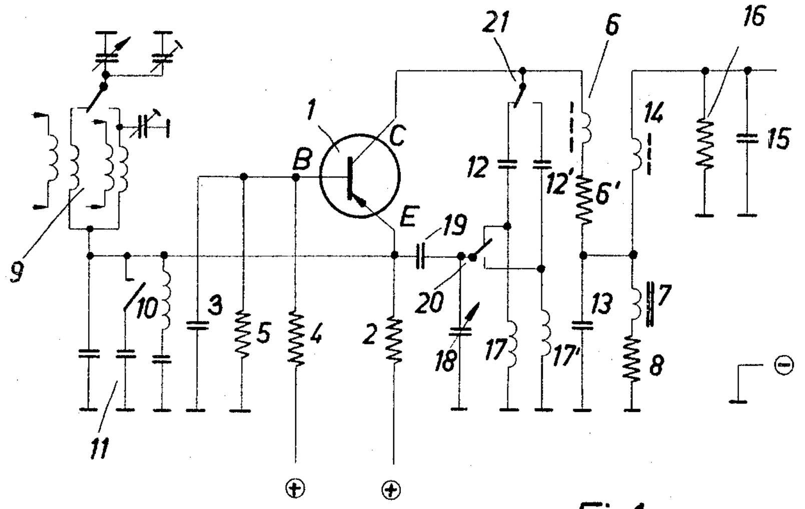
FIGURE 1 is a circuit diagram of one embodiment of a transistorized self-heterodyning mixer stage according to the present invention.

Referring now to the drawings and to FIGURE 1 thereof in particular, the same shows a transistorized self-heterodyning mixer stage according to the present invention, the same incorporating a transistor 1 having a base B, a collector C and an emitter E. The positive battery voltage is applied to the emitter E via a resistor 2. The base B is grounded for the receiving, oscillator and intermediate frequencies via a capacitor 3. The direct current working point of the transistor 1 is adjusted, in a manner well known per se, by means of the resistors 4 and 5. The collector C of the transistor 1 is grounded via the primary coil 6 of the intermediate frequency band filter, a damping resistance 6', a choke 7 and a damping resistance 8. In the illustrated embodiment, ground potential also represents the negative battery potential.

The input signal is applied to the emitter E of the transistor 1 via a continuously tunable input resistor or a capacitatively tunable band filter 9, there being a suitable input stage. The latter includes a series-circuit constituted by a switch 10 and a capacitor 11, so that the frequency variation can be adapted to the desired band, i.e., so that the input circuit can be matched to the mixer stage.

Connected to the collector circuit is the intermediate frequency band filter, the same incorporating the primary capacitor 12, as well as the above-mentioned components 6, 6', 7, 8, as well as the base point coupling capacitor 13. As is apparent from FIGURE 1, the choke coil 7, which serves for purposes of rectification, and the damping resistance 8 form a series-circuit which is in parallel with the capacitor 13. In practice, the components 7 and 8 can be constituted by a lossy choke. The secondary circuit of the intermediate frequency band filter is constituted by an inductance 14 and by the parallely connected capacitor 15 and damping resistor 16. The capacitative base point coupling afforded by the capacitor 13 prevents, to a large extent, the oscillator frequency from being introduced into the intermediate frequency amplifier, which is connected to the output of the circuit.

Connected to that terminal of the capacitor 12 which is opposite to the terminal connected to the collector is the oscillator circuit, the same including an inductance 17 and a variable capacitor 18. This oscillator circuit per se is conventional, as shown, for example, in German Patent No. 1,022,272. This oscillator circuit is designed such that the oscillator frequency with the same capacitance (variable capacitor or diode) in band I covers the values 87.15 to 101.15 megacycles and in band III, 214.15 to 263.15 megacycles. Feedback is effected to the emitter E of the transistor via further capacitor 19. This feedback path can be blocked for the intermediate frequency by means of a broad-band blocking circuit (not shown).

The coarse frequency change-over from the lower to the higher frequency band (band I to band III) and vice versa is effected by switching the coils 17, 17' of the oscillator circuit by means of a switch 20. It will be appreciated that, as a result of this switch-over, the parameters of the capacitative branch will be interfered with, since, in the capacitative branch a change in the capacitance of capacitor 18 has no influence on the intermediate frequency circuit. According to the present invention, however, the influence of the switching of the coils 17, 17' on the intermediate frequency circuit is compensated by means of a further switch 21, which causes a different capacitor 12' to be switched into the circuit.

It will be seen from the above that while the switch 20 constitutes a means for switching the coil means of the oscillator circuit for switching the oscillator circuit to respective channels of the lower frequency band, the switch 21 constitutes a means for switching the frequency-determining circuit component of the intermediate frequency circuit, when the oscillator circuit is switched, to a value which compensates for a frequency variation of the intermediate frequency circuit that is due to the switching of the oscillator circuit.

Here, attention should be directed to the fact that while certain individual features of the above-described circuit are conventional, the prior art has not appreciated the syllogistic effect obtainable by combining the various features to achieve the desired result. Thus, the published German patent application No. 1,046,118 shows, in FIGURE 7, that the base of the transistor may be capacitatively grounded for the receiving, oscillator and intermediate frequency, while the receiving signal is applied to the emitter and the collector is connected to the intermediate frequency circuit in whose capacitative branch is arranged the oscillator circuit, the feedback taking place capacitatively from the oscillator circuit to the emitter. This, however, solves only a portion of the problem at hand, namely, the decoupling of the receiving and oscillator circuits from one another. Furthermore, dimensioning the oscillator circuit such that it represents a very small impedance as compared with the capacitance of the intermediate frequency circuit, the latter only slightly detuning the intermediate frequency circuit even when the capacitance of the capacitor is varied, and tuning the oscillator circuit to the middle part of the whole frequency band, has not heretofore been known for the case where the receiving, oscillator and intermediate frequencies are close together. Nor could this condition be satisfied without at the same time letting the frequency-determining switch component of the intermediate frequency circuit, on switching over of the oscillator circuit, be changed to a value such that a change in frequency of the intermediate frequency circuit is compensated for by the changing over of the oscillator circuit. All that has heretofore been known is that, in a self-heterodyning transistor mixer stage where the oscillator circuit is in the capacitative branch of the intermediate frequency circuit, the oscillator coil for the intermediate frequency is to be so designed as to represent a very low inductive resistance, see German published application No. 1,080,630.

Figure 2:
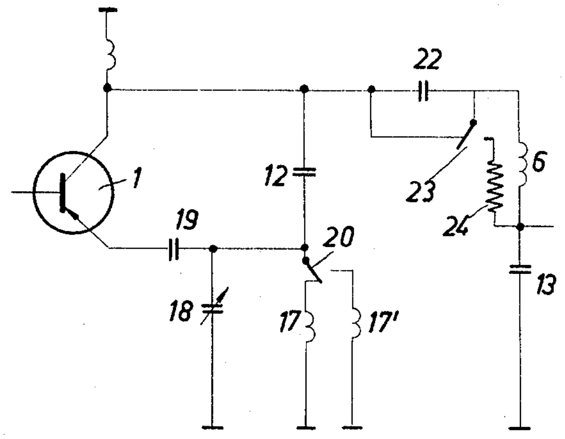
FIGURE 2 is a circuit diagram showing a portion of another embodiment of a transistorized self-heterodyning mixer stage according to the present invention.

In the embodiment of FIGURE 2, the capacitor 12 remains unchanged at all times. Instead, the frequency-determining circuit component of the intermediate frequency circuit comprises a coupling capacitor 22 which is connected in series with the coil 6, the capacitor 22 being short-circuitable by means of a switch 23 which, when the same does not short-circuit the capacitor 22, is effective to connect a resistor 24 in parallel with the coil 6. In this way, the intermediate frequency band filter will have approximately the same pass characteristic in both of the operating bands. At the same time, the amplification will be different for the two bands and this, in turn, compensates for the different amplification, at the different frequencies in the two bands, resulting from the above-mentioned input stage.

Figure 3:
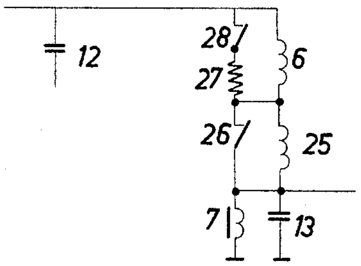
FIGURE 3 is a circuit diagram of yet another embodiment of a transistorized self-heterodyning mixer stage according to the present invention.

The circuit of FIGURE 3 shows the intermediate frequency inductance as being constituted by two serially connected coils 6 and 25. Connected across the coil 25 is a short-circuiting switch 26, while connected across the coil 6 is a series-circuit constituted by a damping resistance 27 and a switch 28. While the circuit is to operate in its lower frequency band (band I) both switches are closed so that the coil 25 is short-circuited and the coil 6 is damped by the resistor 27. In this way, the intermediate frequency band filter will have approximately the same band characteristic for operation in both the lower and higher band.

In practice, the rotary capacitor will be equipped with different trimmer capacitors, which will generally be connected in parallel, in order to make it possible to obtain the necessary frequency variation in the different bands.

It will be understood that the above description of the present invention is susceptible to various modifications, changes and adaptations, and the same are intended to be comprehended within the meaning and range of equivalents of the appended claims.

What is claimed is:

1. For use in a television receiver capable of operating in a lower and a higher frequency band, a self-heterodyning transistor mixer stage in which the receiving, oscillator and intermediate frequencies are all close to one another, said stage comprising, in combination:

(a) a transistor having a base, collector and emitter;

(b) means for capacitatively grounding said base for the receiving, oscillator and intermediate frequencies;

(c) means for applying the received signal to said emitter;

(d) an intermediate frequency circuit connected to said collector, said intermediate frequency circuit having means forming a capacitative branch and a frequency-determining circuit component;

(e) an oscillator circuit having switchable coil means and tuning capacitor means, said oscillator circuit being connected to said capacitative branch of said intermediate frequency circuit;

(f) means for providing a capacitative feedback connection from said oscillator circuit to said emitter;

(g) said coil means and tuning capacitor means of said oscillator circuit acting inductively for the intermediate frequency in said lower band and being dimensioned to impart to said oscillator circuit an impedance which is very small as compared to the capacitance of said capacitative branch of said intermediate frequency circuit and which, even when the capacitance of said tuning capacitor means is varied, detunes said intermediate frequency circuit but slightly, said oscillator circuit being tuned to a channel which is in the middle of the entire frequency band;

(h) means for switching said coil means of said oscillator circuit for switching said oscillator circuit to respective channels of said lower frequency band; and (i) means for switching said frequency determining circuit component of said intermediate frequency circuit, when said oscillator circuit is switched, to a value which compensates for a frequency variation of said intermediate frequency circuit that is due to the switching of said oscillator circuit.

2. A stge as defined in claim 1 wherein said frequency determining element comprises a capacitor connected in said capacitative branch of said intermediate frequency circuit, the latter being serially connected with said oscillator circuit.

3. A stage as defined in claim 1 wherein said intermediate frequency circuit comprises an inductive branch having coil means and wherein said frequency determining component comprises a capacitor which is part of said inductive branch and is in series with said last-mentioned coil means.

4. A stage as defined in claim 3 wherein said capacitor constituting said frequency determining component is switched by short-circuit means connected to said last-mentioned capacitor.

5. A stage as defined in claim 4 wherein said short-circuit means, when not short-circuiting said capacitor, are effective to connect a resistor across said coil means incorporated in said inductive branch.

6. A stage as defined in claim 4 wherein means are provided for varying the inductance of said coil means in said inductive branch of said intermediate frequency circuit.

7. A stage as defined in claim 1, further comprising means for damping said intermediate frequency circuit differently for operation in said lower and higher bands.

No references cited.

KATHLEEN H. CLAFFY, *Primary Examiner.*